(12) United States Patent
Kita et al.

(10) Patent No.: US 9,715,915 B2
(45) Date of Patent: Jul. 25, 2017

(54) MAGNETO-RESISTIVE DEVICES INCLUDING A FREE LAYER HAVING DIFFERENT MAGNETIC PROPERTIES DURING OPERATIONS

(71) Applicants: Eiji Kita, Tsukuba-si (JP); Yoshiaki Sonobe, Yokohama (JP)

(72) Inventors: Eiji Kita, Tsukuba-si (JP); Yoshiaki Sonobe, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/922,530

(22) Filed: Oct. 26, 2015

(65) Prior Publication Data

US 2016/0125924 A1    May 5, 2016

(30) Foreign Application Priority Data

Oct. 30, 2014   (JP) .................................. 2014-221404
Mar. 27, 2015   (KR) ......................... 10-2015-0043084

(51) Int. Cl.

| | | |
|---|---|---|
| G11B 5/39 | (2006.01) | |
| G11C 11/16 | (2006.01) | |
| H01L 43/08 | (2006.01) | |
| H01L 43/10 | (2006.01) | |
| H01L 43/02 | (2006.01) | |
| H01L 27/22 | (2006.01) | |

(52) U.S. Cl.
CPC .......... *G11C 11/161* (2013.01); *G11B 5/3906* (2013.01); *G11B 5/3909* (2013.01); *G11C 11/1673* (2013.01); *G11C 11/1675* (2013.01); *H01L 43/02* (2013.01); *H01L 43/08* (2013.01); *H01L 43/10* (2013.01); *H01L 27/228* (2013.01)

(58) Field of Classification Search
CPC ..... G11B 5/3909; G11B 5/3906; H01L 43/02; H01L 43/08; H01L 43/10
USPC .......................................... 360/324.12, 324.2
See application file for complete search history.

(56) References Cited

U.S. PATENT DOCUMENTS

| | | | |
|---|---|---|---|
| 7,307,302 B2 | 12/2007 | Saito | |
| 7,777,261 B2 | 8/2010 | Huai et al. | |
| 8,107,281 B2 | 1/2012 | Kai et al. | |
| 8,183,654 B2 * | 5/2012 | Zheng | H01L 43/08 257/421 |
| 8,536,669 B2 | 9/2013 | Zhu et al. | |
| 8,592,929 B2 * | 11/2013 | Chen | G11C 11/161 257/421 |
| 8,680,632 B2 | 3/2014 | Daibou et al. | |
| 8,698,259 B2 | 4/2014 | Krounbi et al. | |

(Continued)

FOREIGN PATENT DOCUMENTS

| | | |
|---|---|---|
| JP | 2005-032878 | 2/2005 |
| JP | 2005-150303 | 6/2005 |

(Continued)

*Primary Examiner* — Jefferson Evans
(74) *Attorney, Agent, or Firm* — Myers Bigel, P.A.

(57) ABSTRACT

Magneto-resistive devices with lower power consumption and higher stability are provided. The magneto-resistive devices may include a pinned layer, a free layer and an insulating layer between the pinned layer and the free layer. The pinned layer, the free layer and the insulating layer may constitute a magnetic tunnel junction. The free layer may include a first magnetic layer and a second magnetic layer that has a Curie temperature lower than a Curie temperature of the first magnetic layer.

19 Claims, 12 Drawing Sheets

(56) References Cited

U.S. PATENT DOCUMENTS

| | | | |
|---|---|---|---|
| 2003/0184925 A1* | 10/2003 | Hasegawa | B82Y 10/00 360/324.12 |
| 2004/0165428 A1* | 8/2004 | Odagawa | B82Y 10/00 365/171 |
| 2005/0041456 A1 | 2/2005 | Saito | |
| 2006/0268604 A1 | 11/2006 | Onogi et al. | |
| 2007/0063236 A1 | 3/2007 | Huai et al. | |
| 2010/0176471 A1 | 7/2010 | Zhu et al. | |
| 2011/0051503 A1* | 3/2011 | Hu | G11C 11/16 365/158 |
| 2011/0073970 A1 | 3/2011 | Kai et al. | |
| 2012/0205758 A1* | 8/2012 | Jan | H01L 29/66984 257/421 |
| 2012/0212998 A1* | 8/2012 | Ranjan | B82Y 10/00 365/158 |
| 2012/0241881 A1 | 9/2012 | Daibou et al. | |
| 2013/0154035 A1 | 6/2013 | Krounbi et al. | |
| 2013/0161770 A1* | 6/2013 | Meng | H01L 43/02 257/421 |
| 2013/0177781 A1* | 7/2013 | Chepulskyy | G11C 11/161 428/811.1 |
| 2014/0339660 A1* | 11/2014 | Lee | H01L 43/08 257/421 |
| 2015/0294703 A1* | 10/2015 | Apalkov | H01L 43/08 365/158 |
| 2015/0295167 A1* | 10/2015 | Apalkov | H01L 43/08 257/421 |
| 2016/0079520 A1* | 3/2016 | Park | H01L 29/82 257/421 |

FOREIGN PATENT DOCUMENTS

| | | |
|---|---|---|
| JP | 2006-332218 | 12/2006 |
| JP | 2009-509357 | 3/2009 |
| JP | 2011-071352 | 4/2011 |
| JP | 2012-204683 | 10/2012 |
| JP | 2014-078722 | 4/2014 |
| JP | 2014-116474 | 6/2014 |

* cited by examiner

MAGNETO-RESISTIVE DEVICES INCLUDING A FREE LAYER HAVING DIFFERENT MAGNETIC PROPERTIES DURING OPERATIONS

CROSS-REFERENCE TO RELATED APPLICATIONS

This U.S. non-provisional patent application claims priority under 35 U.S.C. §119 to Japanese Patent Application No. 2014-221404, filed on Oct. 30, 2014, in the Japan Patent Office, and Korean Patent Application No. 10-2015-0043084, filed on Mar. 27, 2015, in the Korean Intellectual Property Office, the disclosures of which are hereby incorporated by reference in their entireties.

BACKGROUND OF THE INVENTION

Example embodiments of the inventive concepts generally relate to a magneto-resistive device including magnetic tunnel junctions, and in particular, to a magnetic tunnel device using a spin transfer magnetization inversion technique and a magneto-resistive device of a magneto-resistive random access memory (MRAM).

A magneto-resistive random access memory (MRAM) is an emerging nonvolatile memory device with excellent properties, such as high speed, low power consumption, and large capacity. In the magneto-resistive memory, a magneto-resistive device with a magnetic tunnel junction (MTJ) is used as a memory element. For example, the magneto-resistive device includes a free layer whose magnetization direction can be changed, a pinned layer whose magnetization direction is fixed to be perpendicular to a surface thereof, and a tunnel barrier layer that is interposed between the free and pinned layers and is formed of an insulating material. The pinned layer, the tunnel barrier layer, and the free layer constitute the magnetic tunnel junction. The magneto-resistive device may be referred to as a "MTJ device".

For the magneto-resistive device, a relative magnetization direction of a pair of magnetic layers separated from each other by the intervening tunnel barrier layer may be adjusted to change magneto-resistance of the magneto-resistive device and store data in the magneto-resistive device. In the magneto-resistive device, a read operation may be performed using such a magneto-resistive effect, and a writing operation may be performed using a spin transfer magnetization inversion technique (e.g., a spin transfer torque (STT) technique).

Ferromagnetic materials with high perpendicular magnetic anisotropy and high spin polarizability are preferred as materials for the pinned and free layers.

In the STT technique for the writing operation, a spin magnetic moment of electrons may be used to invert a magnetization direction of the free layer. The use of the STT technique may makes it possible to more effectively realize a magneto-resistive device with a fine pattern size and a low current property, compared with the conventional method of flowing electric current through a wire. Furthermore, the magneto-resistive device is resistant to thermal disturbance caused by a reduction in pattern size.

The magneto-resistive device is expected to be used as a basic component for a next-generation high density memory device, such as a STT-MRAM.

CoFeB-based materials are extensively used as a material for the free layer. However, for CoFeB-based materials, since the perpendicular magnetic anisotropy is realized using an interface magnetic anisotropy, the use of the CoFeB-based materials may lead to a low perpendicular magnetic anisotropy. In addition, there is a very narrow range in known materials for the free layer.

An alternative method of providing a perpendicular-magnetization preserving layer in MTJs has been proposed. For example, Patent Document 1 (Japanese Patent Publication No. 2005-032878) describes a magneto-resistive device including a magnetization pinned layer whose spin magnetic moment is fixed and perpendicular to a surface thereof, a magnetic writing layer whose spin moment is perpendicular to a surface thereof, a non-magnetic layer provided between the magnetization pinned layer and the magnetic writing layer, and an anti-ferromagnetic layer provided on at least a surface of the magnetization pinned layer.

Also, Patent Document 2 (Japanese Patent Publication No. 2005-150303) describes a magneto-resistive device, in which a ferromagnetic tunnel junction including three layers (e.g., a first ferromagnetic layer, a tunnel barrier layer, and a second ferromagnetic layer) is provided. Here, the first ferromagnetic layer has a coercive force greater than that of the second ferromagnetic layer, and tunnel conductance is changed depending on a relative angle between magnetizations of the first and second ferromagnetic layers. Magnetization of an end portion of the second ferromagnetic layer is fixed and perpendicular with respect to a direction of a magnetization easy axis of the second ferromagnetic layer.

Also, Patent Document 3 (Japanese Patent Publication No. 2011-071352) describes a magneto-resistive device including a first magnetic layer having a magnetization easy axis perpendicular to a surface thereof and a variable magnetization direction, a second magnetic layer having a magnetization easy axis perpendicular to a surface thereof and a fixed magnetization direction, and a first non-magnetic layer provided between the first and second magnetic layers. The first magnetic layer is formed of a ferromagnetic material containing a CoPd or CoPt alloy, in which Co/Pd or Co/Pt layers are alternately stacked on a closed packed plane, and having a c-axis perpendicular to a surface thereof. A magnetization direction of the first magnetic layer is changed by a bi-directional current flowing through the first magnetic layer, the first non-magnetic layer, and the second magnetic layer.

By using the above techniques, it becomes possible to select a material with high spin polarizability from a group including half-metal and Heusler based materials. However, this may lead to an increase in layer thickness of a device and consequently an increase in magnetization switching current and power consumption.

To settle such a problem, a magneto-resistive device capable of reducing a magnetization switching current and providing a low power consumption property is proposed in, for example, Patent Document 4 (Japanese Patent Publication No. 2014-116474). According to the magneto-resistive device described in the Patent Document 4, a memory layer (or a free layer) has a ferromagnetic layer, a perpendicular magnetization preserving layer, and a magnetic-coupling control layer. The magnetic-coupling control layer is provided between the ferromagnetic layer and the perpendicular magnetization preserving layer to control magnetic coupling between the ferromagnetic layer and the perpendicular magnetization preserving layer. A thickness of the magnetic-coupling control layer may be changed to optimize various parameters (e.g., a changing rate of resistance, thermal stability, a write current, and a magnetization switching speed) and reduce a current required for a magnetization switching operation.

SUMMARY

Data-storage media, such as a magneto-resistive memory device, are needed to have a low power consumption property and a high data retention property (i.e., to stably preserve information stored therein). Heat generated in the data-storage media itself or in other devices may be applied to the data-storage media, and thus, it is necessary for a data-storing layer or a free layer of the magneto-resistive device to have high magnetization thermal stability. However, for the magneto-resistive device described in Patent Document 1, it is possible to realize a low power consumption property, but any method for achieving high magnetic stability is not described in Patent Document 1.

Aspects of the present disclosure are to address at least the above-mentioned problems and/or disadvantages and to provide at least a magneto-resistive device with a low power consumption property and improved stability.

According to example embodiments of the inventive concepts, a relationship between a Curie temperature of a ferromagnetic layer included in a free layer and a device temperature of a magneto-resistive device during a writing operation may be considered. For example, by appropriately choosing the Curie temperature for the free layer, it may be possible to reduce the power consumption during the writing operation and to stably preserve a magnetization direction of the free layer. In detail, the magneto-resistive device may be configured to have the following technical features.

A magneto-resistive device may include a magnetic tunnel junction that may include a pinned layer, a free layer that may have a first magnetic anisotropy and may include a first magnetic layer and a second magnetic layer, and an insulating layer between the pinned layer and the free layer. The second magnetic layer may have a Curie temperature that is lower than a Curie temperature of the first magnetic layer and may have a second perpendicular magnetic anisotropy.

According to various embodiments, the Curie temperature of the second magnetic layer may range from about 350K to about 500K.

According to various embodiments, the second magnetic layer may have a perpendicular magnetic anisotropy constant that is higher than $5\times10E5$ J/m$^3$.

In various embodiments, the first magnetic anisotropy may be in-plane.

According to various embodiments, the first magnetic anisotropy may have a direction perpendicular to a surface of the free layer and a magnetic anisotropy constant that is in a range of about $2\times10E5$ J/m$^3$ to about $10E6$ J/m$^3$.

In various embodiments, the free layer may further include a magnetic-coupling control layer that is between the first magnetic layer and the second magnetic layer and is configured to control a magnetic coupling between the first and second magnetic layers.

In various embodiments, the second magnetic layer may include FePtCu, [Co/Pt]n, TbFeCo, Mn2RuGa, Mn2RuGe, or other ferromagnetic material.

According to various embodiments, the magneto-resistive device may have resistance of about 30 $\Omega\mu m^2$ or less.

In various embodiments, the Curie temperature of the second magnetic layer may be lower than a temperature of the second magnetic layer during a writing operation and may be higher than a temperature of the second magnetic layer during a reading operation.

A magneto-resistive device may include a magnetic tunnel junction that may include a pinned layer, a free layer including a first magnetic layer that is configured to be paramagnetic during a writing operation and is configured to be ferromagnetic during a reading operation and an insulating layer between the pinned layer and the free layer.

In various embodiments, the free layer may further include a second magnetic layer. The second magnetic layer may be disposed between the insulating layer and the first magnetic layer, and the second magnetic layer may be configured to be ferromagnetic during a writing operation.

According to various embodiments, the free layer may further include a magnetic-coupling control layer disposed between the first magnetic layer and the second magnetic layer.

In various embodiments, the magnetic-coupling control layer may include Pd, Pt, Ru, MgO, Ta and/or W.

In various embodiments, the first magnetic layer may have a Curie temperature that is lower than a Curie temperature of the second magnetic layer.

In various embodiments, the first magnetic layer may have a magnetic anisotropy that is perpendicular to a surface of the magnetic layer.

A magneto-resistive device may include a magnetic tunnel junction that may include a pinned layer, a free layer including a first magnetic layer having a first Curie temperature that is lower than a temperature of the first magnetic layer during a writing operation and is higher than a temperature of the first magnetic layer during a reading operation and an insulating layer between the pinned layer and the free layer.

In various embodiments, the free layer may further include a second magnetic layer. The second magnetic layer may be disposed between the insulating layer and the first magnetic layer, and the second magnetic layer may has a second Curie temperature that is higher than the first Curie temperature.

According to various embodiments, the free layer may further include a magnetic-coupling control layer disposed between the first magnetic layer and the second magnetic layer. According to various embodiments, the magnetic-coupling control layer may include Pd, Pt, Ru, MgO, Ta and/or W.

In various embodiments, the first Curie temperature may range from about 350K to about 500K.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
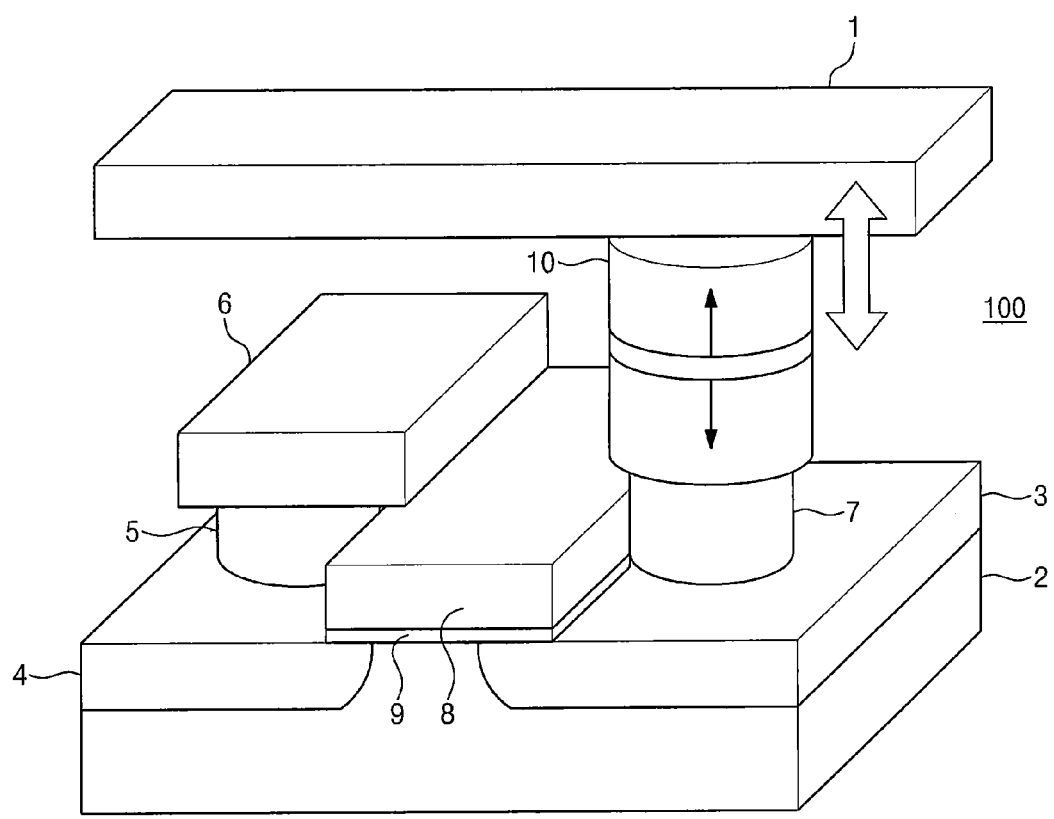
FIG. 1 is a perspective view illustrating an example of an MRAM device including a magneto-resistive device according to example embodiments of the inventive concepts.

It should be noted that these figures are intended to illustrate the general characteristics of methods, structure and/or materials utilized in certain example embodiments and to supplement the written description provided below. These drawings are not, however, to scale, may not precisely reflect the precise structural or performance characteristics of any given embodiment and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The structure of an MRAM device will be described below.

Figure 2:
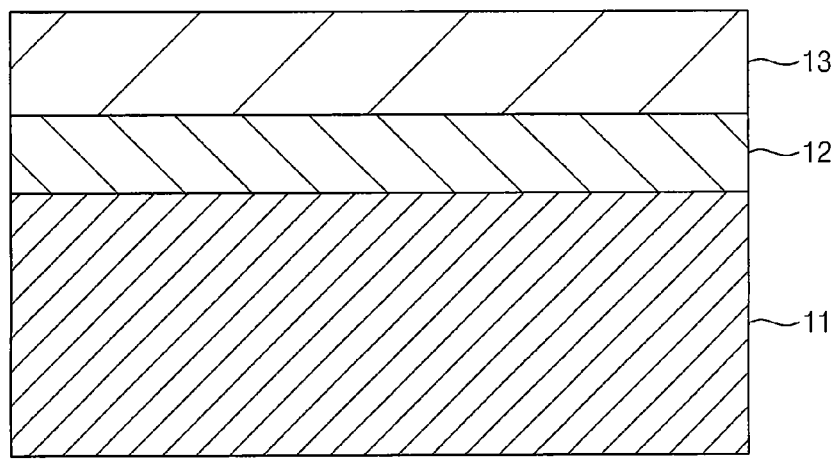
FIG. 2 is a sectional view illustrating an example of a magneto-resistive device according to example embodiments of the inventive concepts.

FIG. 1 is a perspective view illustrating an example of an MRAM device including a magneto-resistive device according to example embodiments of the inventive concepts. FIG. 2 is a sectional view illustrating an example of a magneto-resistive device according to example embodiments of the inventive concepts. The magneto-resistive device according to example embodiments of the inventive concepts will be described with reference to FIGS. 1 and 2.

FIG. 1 illustrates a core portion of a MRAM device including a memory cell 100, a bit line 1, contact plugs 5 and 7, and a word line 8.

The memory cell 100 may include a semiconductor substrate 2, diffusion regions 3 and 4, a source line 6, a gate insulating layer 9, and a magneto-resistive device 10.

In the MRAM, a plurality of the memory cells 100 may be provided in a matrix, and a plurality of bit lines 1 and a plurality of word lines 8 may be provided to connect the memory cells 100 to each other. In the MRAM device, a writing operation may be performed using a spin transfer torque technique.

The diffusion regions 3 and 4 may be provided in a top portion of the semiconductor substrate 2, and the diffusion region 3 may be disposed spaced apart from the diffusion region 4 by a specific distance. The diffusion region 3 may serve as a drain region, and the diffusion region 4 may serve as a source region. The diffusion region 3 may be connected to the magneto-resistive device 10 through the contact plug 7.

The bit line 1 may be provided on the semiconductor substrate 2 and may be connected to the magneto-resistive device 10. The bit line 1 may be connected to a write circuit (not shown) and a read circuit (not shown).

The diffusion region 4 may be connected to the source line 6 through the contact plug 5. The source line 6 may be connected to the write circuit (not shown) and the read circuit (not shown).

The word line 8 may be provided on the semiconductor substrate 2 to be overlapped with the diffusion regions 3 and 4, when viewed in a plan view. The gate insulating layer 9 may be interposed between the word line 8 and the semiconductor substrate 2. The word line 8 and the gate insulating layer 9 may serve as a selection transistor. When a current supplied from a circuit (not shown) is applied to the word line 8, the selection transistor may be turned on or activated.

Hereinafter, a structure of the magneto-resistive device will be described in more detail.

As shown in FIG. 2, the magneto-resistive device 10 may include a pinned layer 11, an insulating layer 12, and a free layer 13 which are sequentially stacked on the semiconductor substrate 2. Alternatively, the layers may be stacked in reverse order. The reverse stacking order may be similarly applied to realize magneto-resistive devices, which will be described below with reference to other figures, according to other example embodiments of the inventive concepts. The pinned layer 11, the insulating layer 12, and the free layer 13 of the magneto-resistive device 10 may constitute a magnetic tunnel junction (MTJ). In addition, unless expressly so defined herein, terms "magneto-resistive device" and "magnetic tunnel junction device (MTJ device)" should be understood to have the same technical meaning.

In the magneto-resistive device 10, the writing operation may be performed using a spin transfer magnetization inversion technique (e.g., a STT technique). In other words, the magneto-resistive device 10 may be a magneto-resistive device using the STT technique. In detail, during the writing operation, a current flowing from the pinned layer 11 to the free layer 13 or from the free layer 13 to the pinned layer 11 may be produced. A direction of the current is perpendicular to a surface of each of the pinned layer 11 and the free layer 13. Accordingly, electrons with spin information may be injected from the pinned layer 11 to the free layer 13. Owing to the law of spin angular momentum conservation, the spin-angular momentum of the injected electrons may be transferred to electrons in the free layer 13 to switch a magnetization of the free layer 13. In other words, a relative angle between magnetizations of the pinned layer 11 and the free layer 13 is switched to a parallel or an antiparallel state (i.e., a low-resistance state or a high-resistance state, respectively), depending on an injection direction of a spin-polarized current flowing in the direction perpendicular to a surface of each layer. This switching mechanism makes it possible for the magneto-resistive device 10 to have binary data (i.e., "0" or "1").

The pinned layer 11 may be formed of a ferromagnetic metal. The ferromagnetic metal may include, for example, at least one of Fe, Ni, CoFeB, Co/Pt, Co/Pd, or a combination thereof. A magnetization of the pinned layer 11 may have a fixed direction. For example, the pinned layer 11 may have a magnetization direction fixed perpendicular to the surface thereof. The pinned layer 11 may be formed of a material, whose magnetization direction is not easily switched, compared with the free layer 13. For example, the pinned layer 11 may be formed of at least one of materials having a high effective magnetic anisotropy (Kueff) and high saturation magnetization (Ms). However, the material for the pinned layer 11 is not limited to a specific one, and various materials can be selected for the pinned layer 11, in consideration of several conditions or technical requirements. The pinned layer 11 may be referred to as one of a magnetization pinned layer, a magnetization fixed layer, a reference layer, a magnetization reference layer, a pin layer, a base layer, or a magnetization base layer.

The insulating layer 12 may serve as a tunnel barrier layer and may be an oxide layer of NaCl structure. For example, the insulating layer 12 may be formed of an insulating layer (e.g., of MgO). In certain embodiments, the insulating layer 12 may include at least one of MgO, CaO, SrO, TiO, VO, NbO, and $Al_2O_3$, but, if the insulating layer 12 is formed of a material capable of providing its own function, example embodiments of the inventive concepts may not be limited to the above materials. A thickness of the insulating layer 12 may be appropriately changed in consideration of a resistance of the magneto-resistive device 10. The insulating layer 12 may be referred to as a tunnel barrier layer or a barrier layer.

The free layer 13 may have a magnetization whose direction can be changed. The magnetization of the free layer 13 may be oriented to be perpendicular to a surface thereof and have one of upward or downward directions. In other words, the free layer 13 may have a magnetization easy axis that is perpendicular to the surface thereof. A thickness of the free layer 13 may be appropriately changed in consideration of a sheet resistance of the magneto-resistive device 10. Also, the free layer 13 may be referred to as a magnetization free layer, a magnetization variable layer, or a memory layer. The free layer 13 may include at least one of, for example, CoFeB, Heusler materials, or MnGe.

Hereinafter, a structure of the free layer of the magneto-resistive device will be described in more detail.

Figure 3:
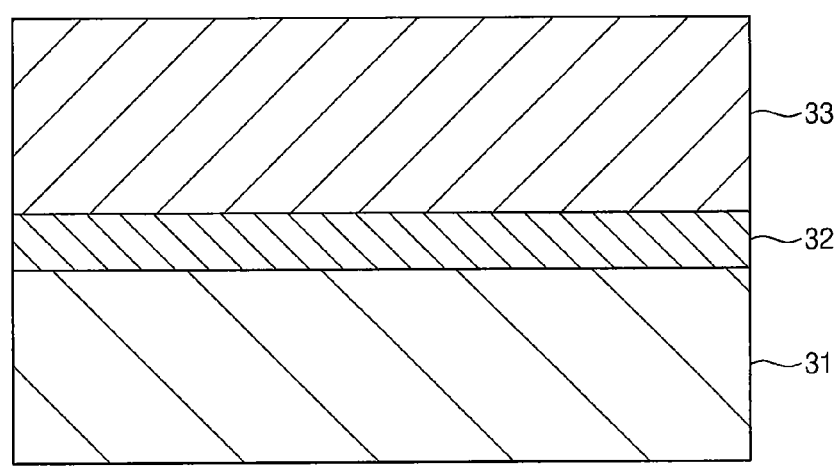
FIG. 3 is a sectional view illustrating a structure of a free layer according to example embodiments of the inventive concepts.

FIG. 3 is a sectional view illustrating a structure of the free layer 13 according to example embodiments of the inventive concepts. The free layer 13 may include a first magnetic layer 31, a magnetic-coupling control layer 32, and a second magnetic layer 33, which are sequentially stacked. In other words, the free layer 13 may be configured in such a way that the magnetic-coupling control layer 32 is provided between the first magnetic layer 31 and the second magnetic layer 33. Hereinafter, it is assumed that the first magnetic layer 31 of the free layer 13 is disposed adjacent to the insulating layer 12.

In light of thermal stability, the first magnetic layer 31 may have the perpendicular magnetic anisotropy. To reduce the write current, when the first magnetic layer 31 is magnetically coupled with the second magnetic layer 33, the first magnetic layer 31 may have a perpendicular magnetization direction. An intrinsic perpendicular magnetic anisotropy may not be required for the first magnetic layer 31 itself. The first magnetic layer 31 may be formed of or include at least one of ferromagnetic materials (e.g., half-metal or Heusler materials).

The magnetic-coupling control layer 32 may be configured to control a magnetic coupling between the first magnetic layer 31 and the second magnetic layer 33. The magnetic-coupling control layer 32 may be formed of or include at least one of, for example, Pd, Pt, Ru, MgO, Ta, or W. Strength of the magnetic coupling may be appropriately adjusted to allow the magnetic-coupling control layer 32 to have a thickness of 2 nm or less, and this may make it possible to optimize some parameters of the magneto-resistive device (e.g., a changing rate of resistance, thermal stability, a write current, and a magnetization switching speed).

The second magnetic layer 33 may be formed of a material whose Curie temperature (Tc) is lower than that the first magnetic layer 31. The second magnetic layer 33 may be formed to have a perpendicular magnetic anisotropy. The second magnetic layer 33 may be formed of at least one of ferromagnetic or ferrimagnetic materials with a perpendicular magnetic anisotropy. The second magnetic layer 33 may be formed of a material having a Curie temperature ranging from about 350K to about 500K. In some embodiments, the upper limit of the Curie temperature of the second magnetic layer 33 may be lower than 450K or 400K.

The second magnetic layer 33 may be formed of a material having a Curie temperature lower than an expected device temperature, which is an expected value of temperature of a magneto-resistive device, on which a writing operation is performed. Generally, the expected device temperature (e.g., a temperature of the free layer or a temperature of a material constituting the free layer) is about 350K to about 400K, and thus, if the Curie temperature of the second magnetic layer 33 is lower than 350K, a reading operation of the magneto-resistive device may have dependence on temperature. For example, the reading operation may suffer from technical issues associated with thermal stability. To avoid these issues, the second magnetic layer 33 may have a Curie temperature higher than a temperature of the second magnetic layer 33 during a reading operation. By contrast, if the Curie temperature of the second magnetic layer 33 is higher than 500K, the second magnetic layer 33 may have a weak dependence on temperature, and thus, it may be difficult to reduce electric power required for the writing operation. To reduce power requirements, the second magnetic layer 33 may have a Curie temperature ranging from about 350K to about 500K. In this manner, it may be possible not only to secure the thermal stability during the reading operation, but also to reduce the power consumption during the writing operation.

In addition, the magneto-resistive device 10 may be configured to have a device resistance of about 30 $\Omega\mu m^2$ or lower. In this manner, it may be possible to use an MRAM device according to example embodiments of the inventive concepts for a system environment using DRAM devices.

Furthermore, FIG. 3 shows an example of the free layer 13 having a three layered structure (e.g., including the first magnetic layer 31, the magnetic-coupling control layer 32, and the second magnetic layer 33). However, in certain embodiments, the free layer 13 may be configured to have a double-layered structure without the magnetic-coupling control layer 32 (e.g., to have the first magnetic layer 31 and the second magnetic layer 33). In other words, the free layer 13 may be provided in the form of a stack constituting the first magnetic layer 31 and the second magnetic layer 33.

Hereinafter, operations in the free layer of the magneto-resistive device will be described in more detail.

The operation associated with the free layer 13 will be described based on the afore-described example of the structure of the free layer 13.

Figure 4:
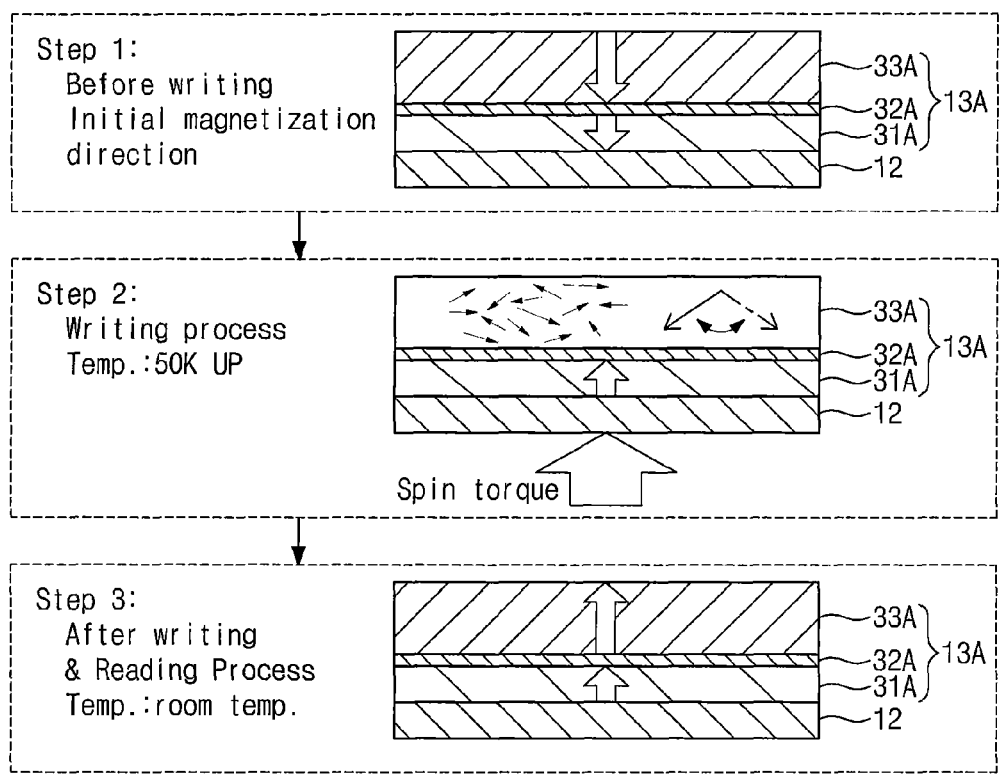
FIG. 4 is a schematic diagram illustrating operations in a free layer, when a writing operation is performed on a magneto-resistive device according to example embodiments of the inventive concepts.

FIG. 4 is a schematic diagram illustrating operations in a free layer 13A, when a writing operation is performed on a magneto-resistive device. A magnetic-coupling control (ECC) layer 32A may be provided between a first magnetic layer 31A and a second magnetic layer 33A. Although FIG. 4 illustrates an example provided with the magnetic-coupling control layer 32A, the magnetic-coupling control layer 32A may be omitted in other examples.

In FIG. 4, the insulating layer 12 is further illustrated to provide better understanding of the operations of the free layer 13A. The insulating layer 12 of FIG. 4 may be an MgO barrier layer.

Hereinafter, unless expressly stated otherwise, a Curie temperature and a perpendicular magnetic anisotropy constant of the first magnetic layer 31A will be respectively denoted by Tc1 and Ku1, and a Curie temperature and a perpendicular magnetic anisotropy constant of the second magnetic layer 33A will be respectively denoted by Tc2 and Ku2.

In the description of FIG. 4, it is assumed that a Curie temperature Tc2 is lower than a Curie temperature Tc1, or is equal to or lower than 500K. In the case where the second magnetic layer 33A (in particular, a material for the second magnetic layer 33A) has temperature lower than the Curie temperature Tc2, it may exhibit a ferromagnetic/ferrimagnetic property, and otherwise, it may exhibit a paramagnetic property.

The perpendicular magnetic anisotropy constants Ku1 and Ku2 may not be limited to specific values, but the first and second magnetic layers 31A and 33A may have the perpendicular magnetization property. The perpendicular magnetic anisotropy constants Ku1 and Ku2 may be the same value, but in some embodiments, they may differ from each other. For example, the perpendicular magnetic anisotropy constant Ku1 may be zero; that is, the first magnetic layer 31A may be formed of a material that does not have the perpendicular magnetic anisotropy. However, the first and second magnetic layers 31A and 33A, taken as a whole, may have the perpendicular magnetic anisotropy.

Each of the perpendicular magnetic anisotropy constants may represent stability in orientation of a magnetization easy axis, and the higher the values the more difficult the magnetization easy axis is changed from the perpendicular direction.

An example of operations, which are performed on the free layer 13A to reduce a magnetization switching current of a magneto-resistive device, will be described with reference to FIG. 4. States of the magnetization direction of the free layer 13A, at step 1 (i.e., before a writing operation), step 2 (i.e., during the writing operation), and step 3 (e.g., after the writing operation), are illustrated by arrows in the first and second magnetic layers 31A and 33A of FIG. 4.

Step 1 illustrates a magnetization direction of the free layer 13A, before the writing operation is performed or a write current flows through the bit line 1 and the word line 8 of FIG. 1. The first magnetic layer 31A (or a high Tc layer) and the second magnetic layer 33A (or a low Tc layer) may have the same downward magnetization direction.

Step 2 illustrates a magnetization direction of the free layer 13, when the writing operation is performed or the write current flows through the bit line 1 and the word line 8 of FIG. 1. The write current may lead to an increase of the temperature of the free layer 13A. For example, the temperature of the second magnetic layer 33A of the free layer 13A may be increased to about 350K to about 400K. For example, a difference in a temperature between the writing and reading operations may range from about 50K to about 100K. In the case where the Curie temperature Tc2 of the second magnetic layer 33A is lower than 500K, the second magnetic layer 33A may have strong dependence on thermal disturbance and may not have a fixed magnetization direction. That is, the second magnetic layer 33A may behave like a paramagnetic material. In other words, if the device temperature is increased above the Curie temperature Tc2, the second magnetic layer 33A may have a randomly oriented magnetic moment and exhibit a paramagnetic property. The magnetization direction of the first magnetic layer 31A may be switched by a flow of spin-polarized electric charges. The magnetization direction of the first magnetic layer 31A may be oriented in an upward direction as shown in FIG. 4. According to such a structure of the free layer 13A of FIG. 4, it may be possible to reduce an amount of electric current required for the writing operation, compared with a combined-type tunnel junction (or a free layer) that have two combined magnetic layers whose Curie temperatures (e.g., 700K) are much higher than a device temperature during the writing operation. This is because only the magnetization direction of the first magnetic layer 31A, not the whole of the free layer 13A, is switched.

Step 3 illustrates a magnetization direction of the free layer 13, after the writing operation is performed or the write current is interrupted. The magnetization direction of the first magnetic layer 31A may be oriented in the upward direction, like that in the case of step 2. As the device temperature decreases, the magnetic moment of the second magnetic layer 33A may be restored to a ferromagnetic structure, and the direction thereof may be oriented in the upward direction, as a result of a magnetic interaction with the first magnetic layer 31A.

In some embodiments, during the reading operation, the device temperature may fall to the room temperature, and the magneto-resistive device may be thermally stable.

Energy for thermal stability (i.e., perpendicular magnetic anisotropy energy) is within a fairly stable range, because it is associated with the perpendicular magnetic anisotropy constants Ku1 and Ku2. In more detail, the perpendicular magnetic anisotropy energy is greater than sixty times the thermal energy (kT) generated by heat, it may be possible to improve thermal stability of the magneto-resistive device. This is because the perpendicular magnetic anisotropy energy is much greater than that in thermal disturbance.

FIG. 4 illustrates the example provided with the magnetic-coupling control layer 32A. In some embodiments, the magnetic-coupling control layer 32A may not be provided, and the operations of the free layer 13A may be substantially the same as that of the above example.

According to the structure of the free layer 13A shown in FIG. 4, it may be possible to preserve high thermal stability of magnetization and reduce an amount of a current for the magnetization switching. Furthermore, the strength in magnetic coupling between the first and second magnetic layers 31A and 33A may be optimized by changing a thickness of the magnetic-coupling control layer 32A.

Hereinafter, properties and test results of the free layer 13 will be described in more detail.

To examine whether electric power consumed for the writing operation is reduced, simulation based on LLG (Landau-Liftshitz-Gilbert-Langevin) equations was performed on the free layer 13 with a double-layered structure (e.g., including the first magnetic layer 31 having a high Curie temperature and the second magnetic layer 33 having a Curie temperature lower than a device temperature during the writing operation). The results of the simulation will be described below in conjunction with a detailed configuration of the free layer 13 used in the simulation.

A change in magnetization switching current or in current-induced switching probability, which is caused by an increase in temperature of the second magnetic layer 33, will be described below.

Figure 5:
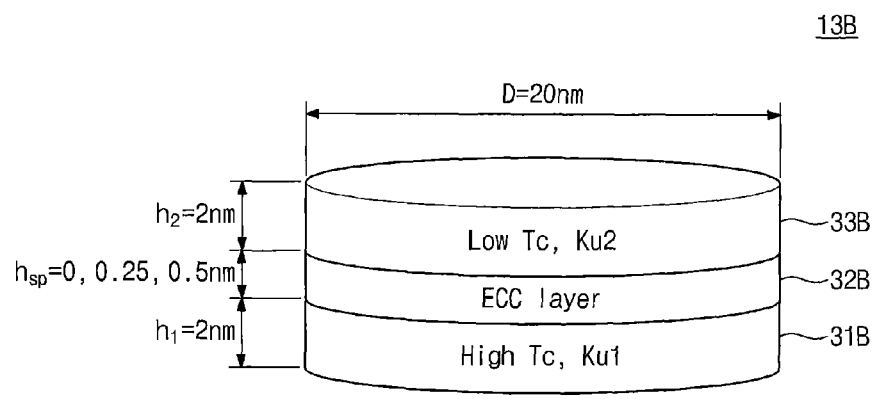
FIG. 5 is a schematic diagram illustrating an example of a free layer used for an LLG simulation.

FIG. 5 is a schematic diagram illustrating a structure of a free layer 13B used for an LLG simulation. The free layer 13B may include a first magnetic layer 31B (or a high Tc layer), a magnetic-coupling control layer 32B (or an ECC layer or a spacer), and a second magnetic layer 33B (or a low Tc layer). Power consumption during a writing operation was evaluated, based on a current density used to switch magnetization of the free layer 13B (the first and second magnetic layers 31 and 33).

A detailed description on parameters for the first and second magnetic layers 31B and 33B is as follows:

(1) First magnetic layer (31B)
Material: MnGe-based material
Magnetic moment (Ms1): 150×10E3 A/m (150 emu/cc)
Perpendicular magnetic anisotropy constant (Ku1): 10×10E5 J/m$^3$ (10×10E6 erg/cc)
Damping constant α=0.005
Curie temperature (Tc1, High Tc): 700K or higher
Polarizability P=1.0

(2) Second magnetic layer (33B)
Material: FePtCu
Magnetic moment (Ms2): 800×10E3 A/m (800 emu/cc)
Perpendicular magnetic anisotropy constant (Ku2): 10×10E5 J/m$^3$ (10×10E6 erg/cc), at room temperature
Damping constant α=0.01
Curie temperature (Tc2, Low Tc): 523.15K In addition, parameters (in CGS units) in parenthesis were used in the LLG simulation. The parameters in SI units can be obtained from the parameters in CGS units using the following conversion formulas (A) and (B).

$$10 \text{ erg/cc} = 1 \text{ J/m3} \quad (A)$$

$$1G = 1 \text{ emu/cc} = 1 \times 10E3 \text{ A/m} \quad (B)$$

Parameters in CGS units in parenthesis were used in other LLG simulations in the present specification.

A thickness of the first magnetic layer 31B was given as 2 nm (i.e., h1=2 nm), a thickness of the magnetic-coupling control layer 32B was given as 0 nm (i.e., hsp=0), and a thickness of the second magnetic layer 33B was given as 2 nm (i.e., h2=2 nm).

A diameter (or width) D of the free layer 13B was 20 nm. Here, the free layer 13B was assumed to have a circular shape, and a size of the free layer 13B was represented by the section diameter D of the free layer 13B. If the free layer 13B has a circular section, the size of the free layer 13B may be represented by its diameter, and in the case of an elliptical section, it may be represented by a length of longitudinal axis. In the case where the free layer 13B has other section, the size of the free layer 13B may be represented by a diameter of a circle that is circumscribed about the free layer 13B.

An increment in temperature (ΔT) was changed from 10° C. to 223° C. During the writing operation, the temperature was changed in the following manner.

The first magnetic layer 31B had a constant temperature of 300K. During the writing operation, the temperature of the second magnetic layer 33B was changed as described below. Even when the temperature of the first magnetic layer 31B was increased, the result was the same.

When the write current was applied, the temperature of the second magnetic layer 33B was increased and reached to a saturation state within 1 ns.

The write current was applied during 10 ns. The device temperature was maintained.

After the writing operation, the temperature of the second magnetic layer 33B was decreased to 300K within 5 ns.

Figure 6:
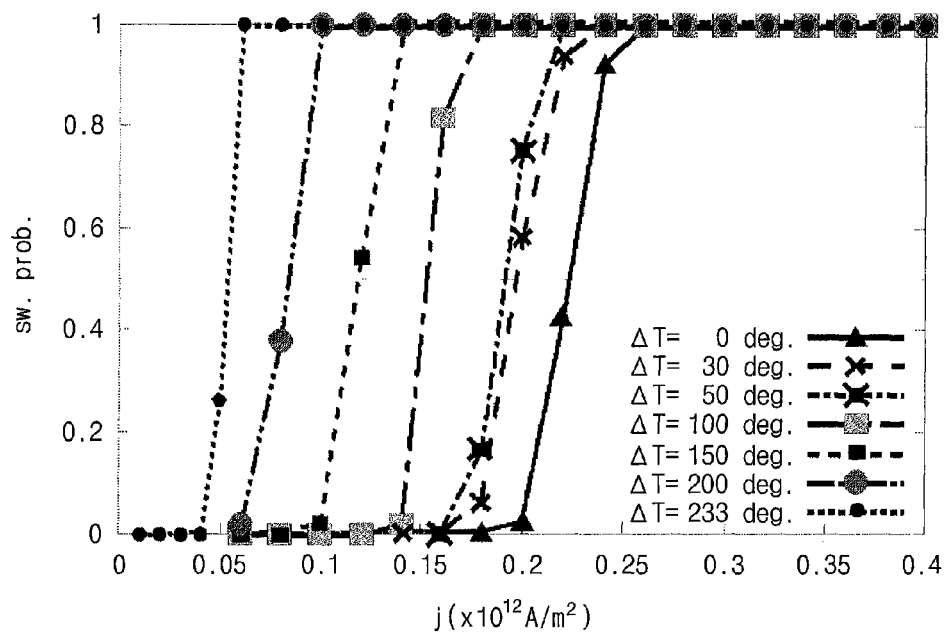
FIG. 6 is a graph showing temperature dependence of write current curves on a temperature of a magneto-resistive device, which were obtained from the LLG simulation of the free layer of FIG. 5.

FIG. 6 is a graph illustrating temperature dependence of write current curves on temperature of a magneto-resistive device, which were obtained from the LLG simulation, and FIG. 6 shows that the write current decreases depending on the temperature serving as a parameter. In the graph of FIG. 6, the horizontal axis represents current density (A/m$^2$) and the vertical axis represents a switching probability (sw. prob). The switching probability represents a switching probability of a magnetization direction of the free layer 13B at an arbitrary current density, and FIG. 6 shows a probability ranging from 0 to 1. In example embodiments of the inventive concepts, if a temperature of the second magnetic layer 33B in the free layer 13B is increased above the Curie temperature Tc2, a switching probability of the free layer 13B may be a switching probability of the first magnetic layer 31B. This is because, during the writing operation on the free layer 13B, the second magnetic layer 33B may be thermally disturbed or may have a paramagnetic property and the magnetization direction of the first magnetic layer 31B may be switched. The magnetization direction of the second magnetic layer 33B may be determined when the device temperature is lowered after the switching the magnetization direction of the first magnetic layer 31B.

In FIG. 6, ΔT (degree ° C., denoted by "deg." in FIG. 6) represents an increment in temperature during the writing operation. Here, it represents the increment in temperature of the second magnetic layer 33B.

As shown in the graph of FIG. 6, when the increment in temperature of the second magnetic layer 33B was increased, a current density required for switching the magnetization direction was decreased. In other words, a current amount (hereinafter, referred to as a "switching current value") required for switching the magnetization direction of the free layer 13B was decreased. In the example of FIG. 6, if a temperature of the second magnetic layer 33B was increased near the Curie temperature Tc2, the switching current value was dropped to one fourth, compared to the case of ΔT=0. In detail, considering current densities giving the switching probability of 0.5, when ΔT approached 223° C. (496.15K, close to Curie temperature Tc2), the switching occurred at a current density that was one fourth of that of the case of ΔT=0.

According to example embodiments of the inventive concepts, it may be possible to reduce an electric power required for performing the writing operation on the magneto-resistive device. If the device temperature is restored to the room temperature, energy for thermal stability depends on a sum of the magnetic anisotropy energy Ku1 and Ku2 of the first and second magnetic layers 31B and 33B, and thus, it is very stable.

As another example, a relationship between a Curie temperature and the power consumption in the writing operation will be described.

Hereinafter, results of an LLG simulation performed on the free layer 13C of FIG. 7 will be described. This simulation was performed to examine whether the switching current value in the writing operation is reduced depending on the Curie temperature of the second magnetic layer 33C. The free layer 13C with a double-layered structure (e.g., including a first magnetic layer 31C having a high Curie temperature and a second magnetic layer 33C having a Curie temperature lower than a device temperature during the writing operation) was used in this simulation.

A detailed description on the free layer 13C is as follows:
(1) First magnetic layer 31C
Material: CoFeB layer
Magnetic moment (Ms1): 1×10E6 A/m (1000 emu/cc)
Perpendicular magnetic anisotropy constant Ku1: 2×10E5 J/m$^3$ (2×10E6 erg/cc)
Damping constant α=0.01
Curie temperature (Tc1): 700K
Polarizability P=1.0
(2) Second magnetic layer 33C
Material: FePtCu layer
Magnetic moment (Ms2): 600×10E3 A/m (600 emu/cc)
Perpendicular magnetic anisotropy constant (Ku2): 2×Ku1
Damping constant α=0.01
Curie temperature (Tc2): 700K, 500K, 450K, 400K
(3) Others
A diameter D of the free layer 13C was from 10 nm to 20 nm.

A thickness of the first magnetic layer 31C was 2 nm (i.e., h1=2 nm), a thickness of the magnetic-coupling control layer 32C was 0 nm (i.e., hsp=0), and a thickness of the second magnetic layer 33C was 2 nm (i.e., h2=2 nm). By setting the thickness of the magnetic-coupling control layer 32C to zero, the free layer 13C do not have the magnetic-coupling control layer 32C.

In the LLG simulation of the free layer 13C, the magnetic anisotropy constant (Ku) was adjusted in such a way that a device temperature of the second magnetic layer 33C had an increment ΔT of 60.

By contrast, a conventional free layer that does not have the double layered structure was also tested as a comparative example. A detailed description on the conventional free layer is as follows:
Material: Co/Ni multilayer
Magnetic moment (Ms): 600×10E3 A/m (600 emu/cc)
Perpendicular magnetic anisotropy constant (Ku): 6×10E5 J/m$^3$ (6×10E6 erg/cc)
Curie temperature (Tc): higher than 700K (426.85° C.)

Figure 7:
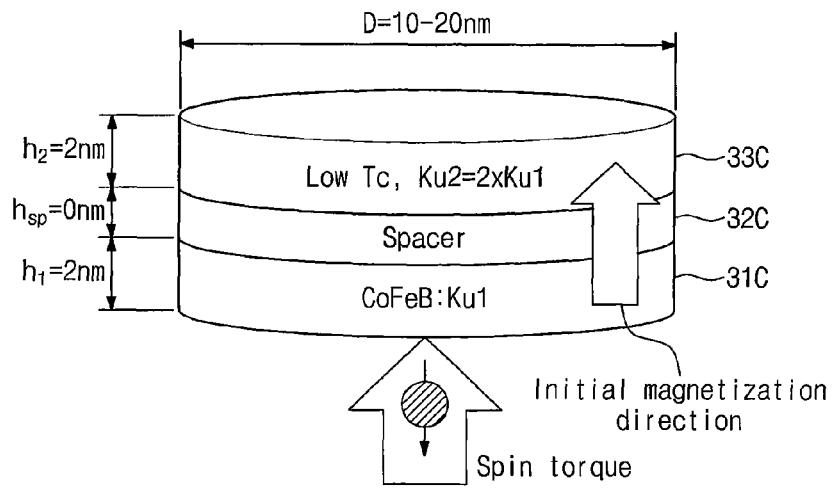
FIG. 7 is a schematic diagram illustrating another example of the free layer used for the LLG simulation.
Figure 8:
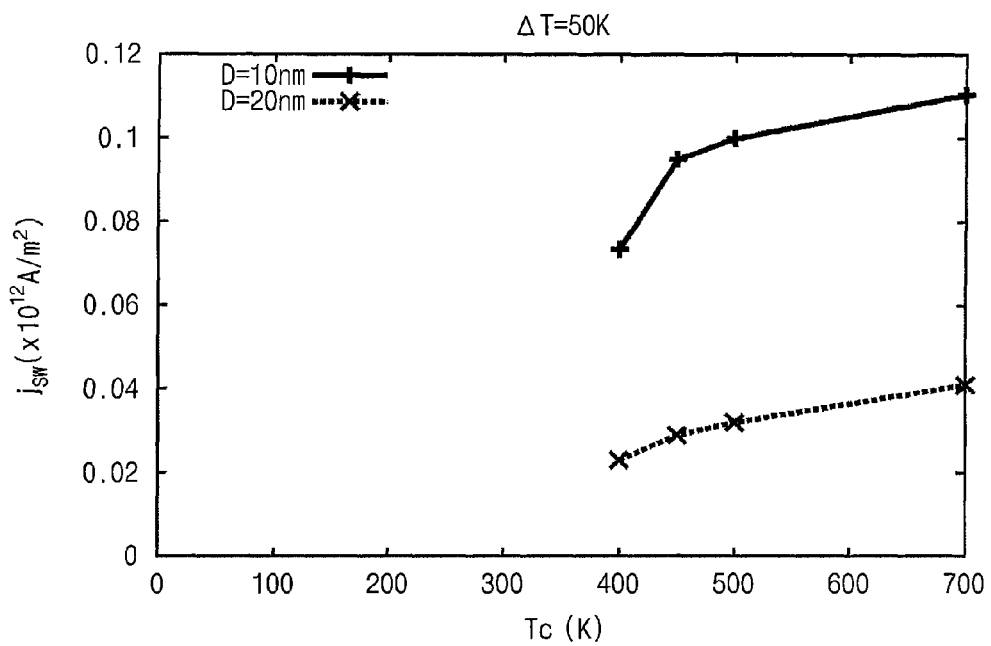
FIG. 8 is a graph showing a relationship between a Curie temperature and a current density, which was obtained from the LLG simulation of the free layer of FIG. 7.
Figure 9:
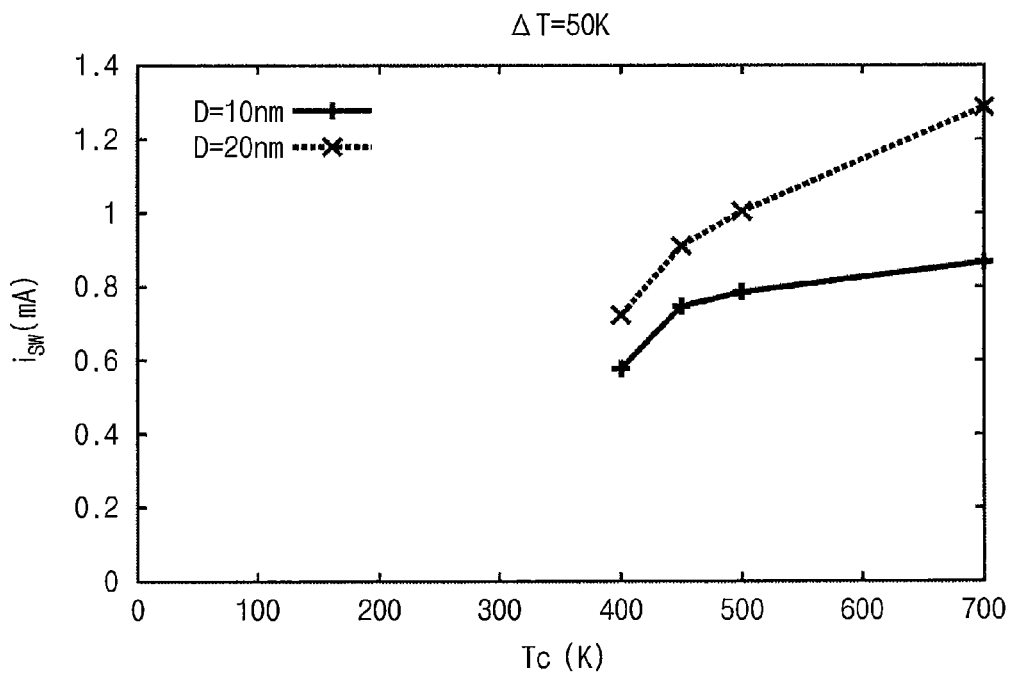
FIG. 9 is a graph showing a relationship between a Curie temperature and a current amount, which was obtained from the LLG simulation of the free layer of FIG. 7.
Figure 10:
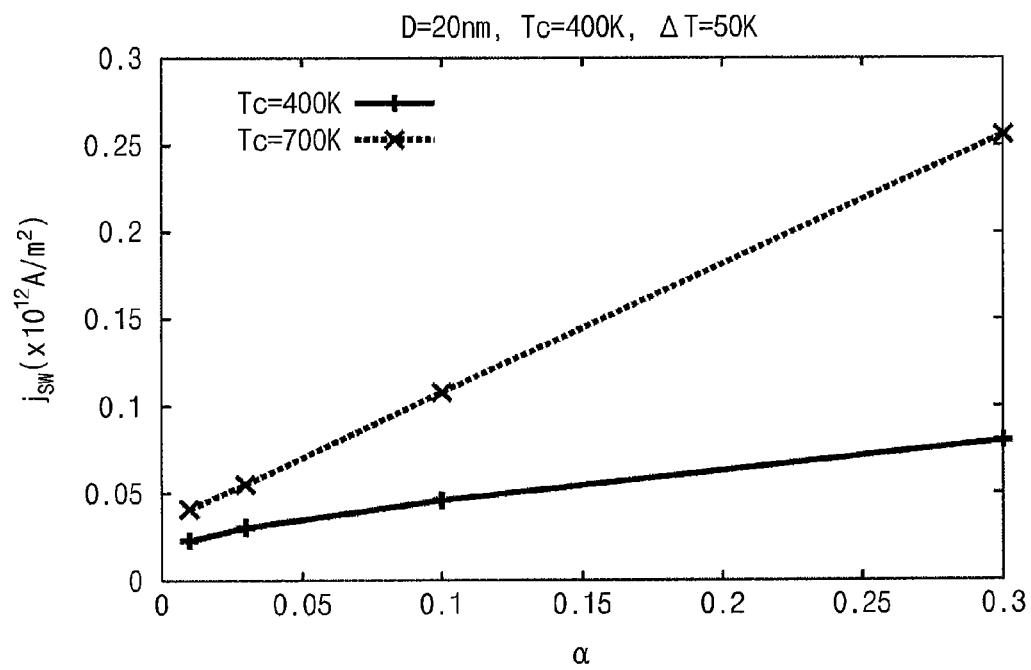
FIG. 10 is a graph showing a relationship between a damping constant, $\alpha$, and a current density, which was obtained from the LLG simulation of the free layer of FIG. 12.

FIGS. 8 through 10 illustrate analysis of the results of the LLG simulation performed of the free layer of FIG. 7. FIG. 8 is a graph showing a relationship between a Curie temperature and a current density, FIG. 9 is a graph showing a relationship between a Curie temperature and a current amount, and FIG. 10 is a graph showing a relationship between a damping constant, a, and a current density. In the LLG simulation of FIGS. 8 through 10, it is assumed that a device temperature of the free layer is increased by 50° C., when a writing operation is performed on a magneto-resistive device.

In the graph of FIG. 8, the horizontal axis represents a Curie temperature Tc (K) and the vertical axis represents a current density $j_{sw}$ (×10$^{12}$ A/m$^2$). In the graph of FIG. 9, the horizontal axis represents a Curie temperature Tc (K) and the vertical axis represents a current amount $i_{sw}$ (mA). FIGS. 8 and 9 represents results of the simulation, in which several values for a Curie temperature Tc2 of the second magnetic layer 33C of example embodiments and a value (e.g., 700K) for a Curie temperature of a conventional free layer (comparative example) were used as the Curie temperature Tc.

The diameter D of the free layer 13C was 10 nm for the solid line and was 20 nm for the dotted line.

As shown in the graph of FIGS. 8 and 9, the use of the free layer 13C whose Curie temperature Tc is lower than 500K may makes it possible to more effectively reduce power consumption, compared with the conventional free layer having a Curie temperature of 700K or higher. For example, if a device temperature of the second magnetic layer 33C is increased by 50° C., the power consumption is reduced by 40-50%.

In the graph of FIG. 10, the horizontal axis represents a damping constant ($\alpha$) of a second magnetic layer, and the vertical axis represents a current density $j_{sw}$ ($\times 10^{12}$ A/m$^2$). In FIG. 10, the solid line represents results obtained from an example embodiment, in which the second magnetic layer 33C of the free layer 13C of FIG. 7 has a Curie temperature of 400K, and the dotted line represents results obtained from the conventional free layer having a Curie temperature of 700K. FIG. 10 shows that the free layer 13C of FIG. 7 had relatively weak dependence on the damping constant $\alpha$ compared with the conventional free layer. This means that it may possible to increase the number of materials that may be used for the second magnetic layer 33C. For example, a magnetic material having a relatively high damping constant and a low Curie temperature Tc can be used for the second magnetic layer 33C.

Figure 11:
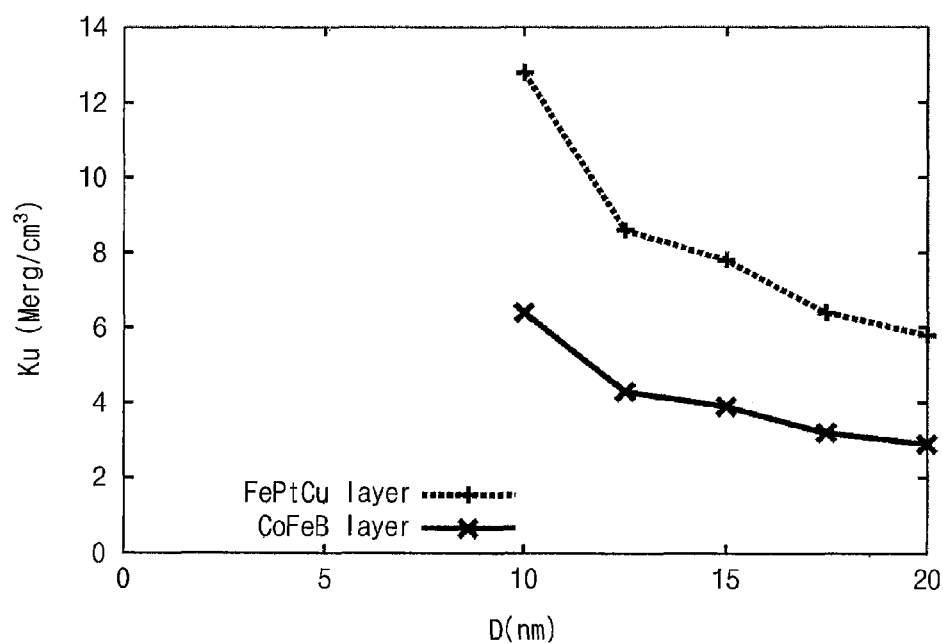
FIG. 11 is a graph showing a relationship between a diameter of a free layer and a perpendicular magnetic anisotropy constant used in the LLG simulation of the free layer of FIG. 7.

FIG. 11 is a graph showing a relationship between the diameter of the free layer 13C and the perpendicular magnetic anisotropy constant Ku used in the LLG simulation of the free layer of FIG. 7. In FIG. 11, the horizontal axis represents the diameter D (nm) of the free layer 13C, and the vertical axis represents the perpendicular magnetic anisotropy constant Ku (Merg/cm$^3$). With regard to materials of the free layer 13C, the solid line represents results obtained from a FePtCu layer for the second magnetic layer 33C, and the dotted line represents results obtained from a CoFeB layer for the first magnetic layer 33A. With respect to the perpendicular magnetic anisotropy constant Ku, thermal stability parameter (KuV/Kt) was adjusted to be 60 (i.e., KuV/Kt=60), and the perpendicular magnetic anisotropy constant Ku2 of the FePtCu layer was adjusted to be two times the perpendicular magnetic anisotropy constant Ku1 of the CoFeB layer (i.e., Ku2 @ FePtCu=2×Ku1 @ CoFeB). During the writing operation, the temperature of the second magnetic layer 33C was increased to 300K.

As shown in FIG. 11, when the free layer 13C has a diameter D of 10 nm, the perpendicular magnetic anisotropy constant Ku has a larger value, and as the diameter D increases, the perpendicular magnetic anisotropy constant Ku decreases. Accordingly, in the case where the size of the magneto-resistive device (e.g., the MTJ device) or the diameter of the free layer is small, the perpendicular magnetic anisotropy constant Ku is needed to have a large value. In addition, FIG. 11 shows that it is necessary to make a difference in the perpendicular magnetic anisotropy constant Ku, depending on a material of the free layer and/or a size of the magneto-resistive device.

In the case that a first magnetic layer does not to have a perpendicular magnetic anisotropy property, the reduction in power consumption will be explained below.

In detail, results of an LLG simulation performed on the free layer 13D of FIG. 12 will be described. The free layer 13D has a double-layered structure including the first magnetic layer 31D and the second magnetic layer 33D.

The first magnetic layer 31D was configured to have a perpendicular magnetic anisotropy constant Ku1 of zero. The test was performed to examine whether it would be possible to reduce electric power for a writing operation, when the first magnetic layer 31D of the free layer 13D does not have a perpendicular magnetic anisotropy property.

A magnetic-coupling control layer 32D (or a spacer) was assumed to have a thickness of 0 (i.e., hsp=0 nm), and thus the free layer 13D was assumed not to have the magnetic-coupling control layer 32D.

A detailed description on the free layer 13D is as follows:
(1) First magnetic layer 31D
Material: a CoFeB or a CFMS layer with in-plane magnetic anisotropy
Magnetic moment (Ms): 1×10E6 A/m (1000 emu/cc)
Perpendicular magnetic anisotropy constant (Ku1): 0 J/m$^3$ (0 erg/cc)
Damping constant $\alpha$=0.01
Curie temperature (Tc1): 700K (426.85° C.)
Polarizability P=1.0
(2) Second magnetic layer 33D
Material: FePtCu layer
Magnetic moment (Ms): 600×10E3 A/m (600 emu/cc)
Perpendicular magnetic anisotropy constant (Ku2): when a diameter D of the free layer ranges from 10 nm to 20 nm, Ku2 was adjusted in such a way that the free layer had a thermal stability constant $\Delta$ of 60
Damping constant $\alpha$=0.01
Curie temperature Tc: 360K, 400K, 450K, 500K, 700K (86.85° C., 126.85° C., 176.85° C., 226.85° C., 426.85° C.)
(3) Others
A diameter D of the free layer 13D was 10-20 nm.
A thickness of the first magnetic layer 31D was 2 nm (i.e., h1=2 nm), a thickness of the magnetic-coupling control layer 320 was 0 nm (i.e., hsp=0), and a thickness of the second magnetic layer 33D was 2 nm (i.e., h2=2 nm).

Several values of Curie temperature Tc of the second magnetic layer 33D were used as a parameter, and a Curie temperature Tc of 700K was assumed as the conventional free layer.

Figure 12:
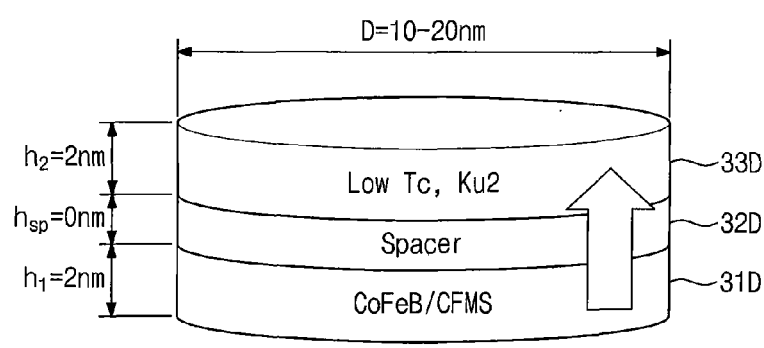
FIG. 12 is a schematic diagram illustrating an example of a free layer, which was used for the LLG simulation and had a first magnetic layer that did not have a perpendicular magnetic anisotropy property.
Figure 13:
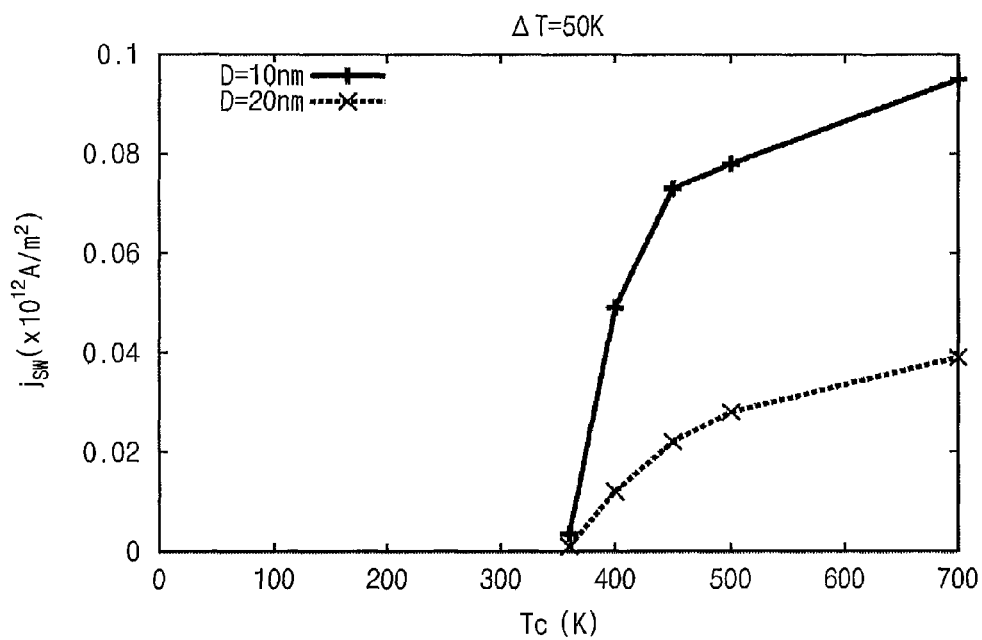
FIG. 13 is a graph showing a relationship between a Curie temperature and a current density, which was obtained from the LLG simulation of the free layer of FIG. 12.
Figure 14:
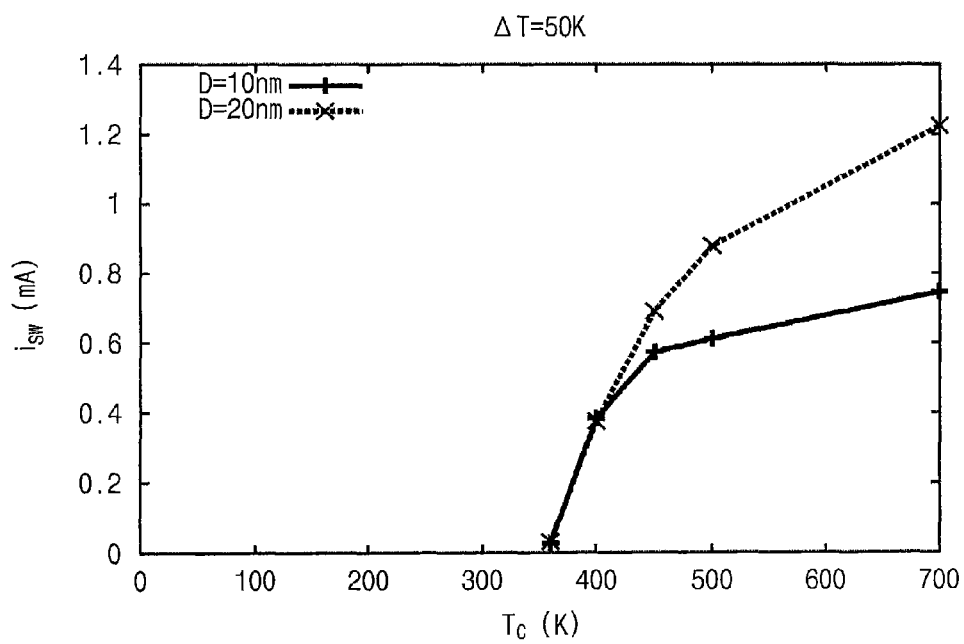
FIG. 14 is a graph showing a relationship between a Curie temperature and a current amount, which was obtained from the LLG simulation of the free layer of FIG. 12.
Figure 15:
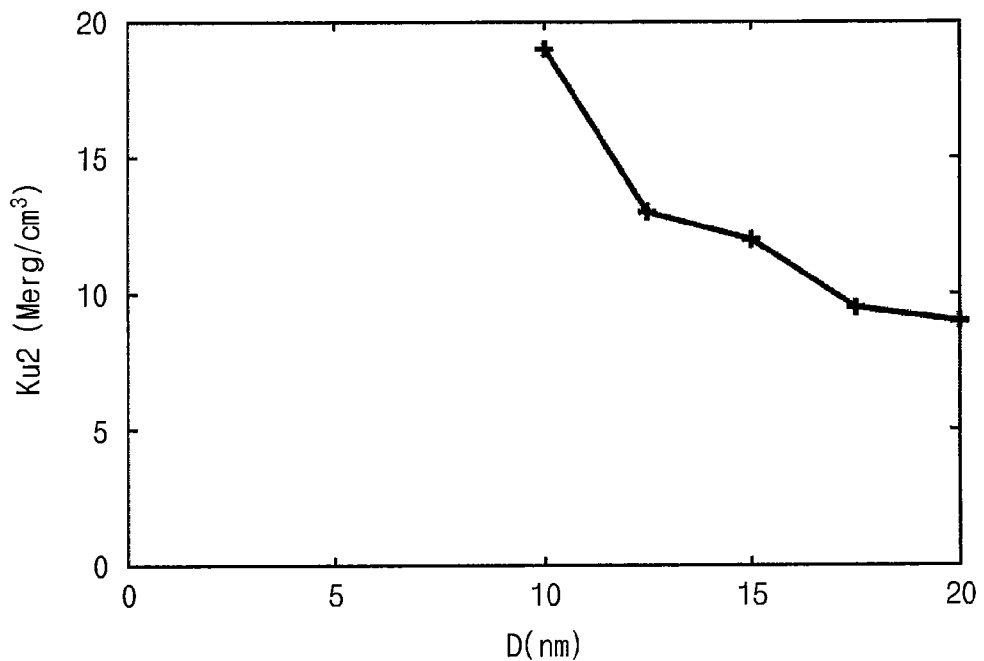
FIG. 15 is a graph showing a relationship between a diameter of a free layer and a perpendicular magnetic anisotropy constant, which was obtained from the LLG simulation of the free layer of FIG. 12.

FIGS. 13 through 15 illustrate analysis of the results of the LLG simulation performed on the free layer of FIG. 12. FIG. 13 is a graph showing a relationship between a Curie temperature and a current density, FIG. 14 is a graph showing a relationship between a Curie temperature and a current amount, and FIG. 15 is a graph showing a relationship between a diameter of a free layer and a perpendicular magnetic anisotropy constant.

In the graph of FIG. 13, the horizontal axis represents a Curie temperature Tc (K) and the vertical axis represents a current density $j_{sw}$ ($\times 10^{12}$ A/m$^2$). In the graph of FIG. 14, the horizontal axis represents a Curie temperature Tc (K) and the vertical axis represents a current amount $i_{sw}$ (mA). FIGS. 13 and 14 show current densities or current amounts according to Curie temperatures, when a magnetic direction of the first magnetic layer 31D was switched.

The diameter D of the free layer 13D was 10 nm for the solid line and was 20 nm for the dotted line.

As shown in FIGS. 13 and 14, power consumption was remarkably reduced, when the free layer 13D was at Curie temperatures of 360K, 400K, and 450K. For example, when the Curie temperature Tc of the second magnetic layer 33D was lower than 400K, if a device temperature was increased by 50° C., the power consumption was reduced by 50-70%. FIGS. 13 and 14 shows that the effect of power reduction can be achieved, even when the first magnetic layer does not have the perpendicular magnetic anisotropy property.

In the graph of FIG. 15, the horizontal axis represents the diameter D of the free layer 13D and the vertical axis represents the perpendicular magnetic anisotropy constant Ku2 (Merg/cm$^3$) of the second magnetic layer 33D. With respect to the perpendicular magnetic anisotropy constant Ku, thermal stability parameter (KuV/Kt) was adjusted to be 60 (i.e., KuV/Kt=60), and the value Ku1 of the CoFeB layer or the CFMS layer was adjusted to be zero. During the writing operation, the temperature of the second magnetic layer 33C was increased to 300K.

As shown in FIG. 15, when the free layer 13D has a diameter D of 10 nm, the perpendicular magnetic anisotropy constant Ku2 has a larger value, and as the diameter D increases, the perpendicular magnetic anisotropy constant Ku2 decreases. Accordingly, in the case where the size of the magneto-resistive device (e.g., the MTJ device) or the diameter of the free layer is small, the perpendicular magnetic anisotropy constant Ku2 of the second magnetic layer 33D is needed to have a large value. That is, in the case where the first magnetic layer 31D does not have a perpendicular magnetic anisotropy property, the second magnetic layer 33D may be needed to have the perpendicular magnetic anisotropy property. In particular, in the case where the free layer 13D has a small diameter or size, it may be necessary to increase the perpendicular magnetic anisotropy constant Ku2, compared with the case that the diameter is large.

Examination of exchange stiffness constants of the first and second magnetic layers will be explained below.

In detail, results of an LLG simulation of the free layer 13D of FIG. 12 and results obtained by examining exchange stiffness constants will be explained. In this test, parameters for the second magnetic layer 33D of the free layer 13D described with reference to FIG. 12 were changed as follows:

Curie temperature (Tc): 400K, 700K (126.85° C., 426.85° C.)

Exchange coupling constant A: 0.1-2.0×10$^{-13}$ J/cm (0.1-2.0×10$^{-6}$ erg/cm)

In this test, it is assumed that, during a writing operation, a device temperature is increased by 50° C.

Points depicted by Tc=400K correspond to a free layer according to example embodiments of the inventive concepts, and other points depicted as Tc=700K correspond to the conventional free layer. The LLG simulation was performed on cases in which the free layers have diameters D of 10 nm and 20 nm.

Figure 16:
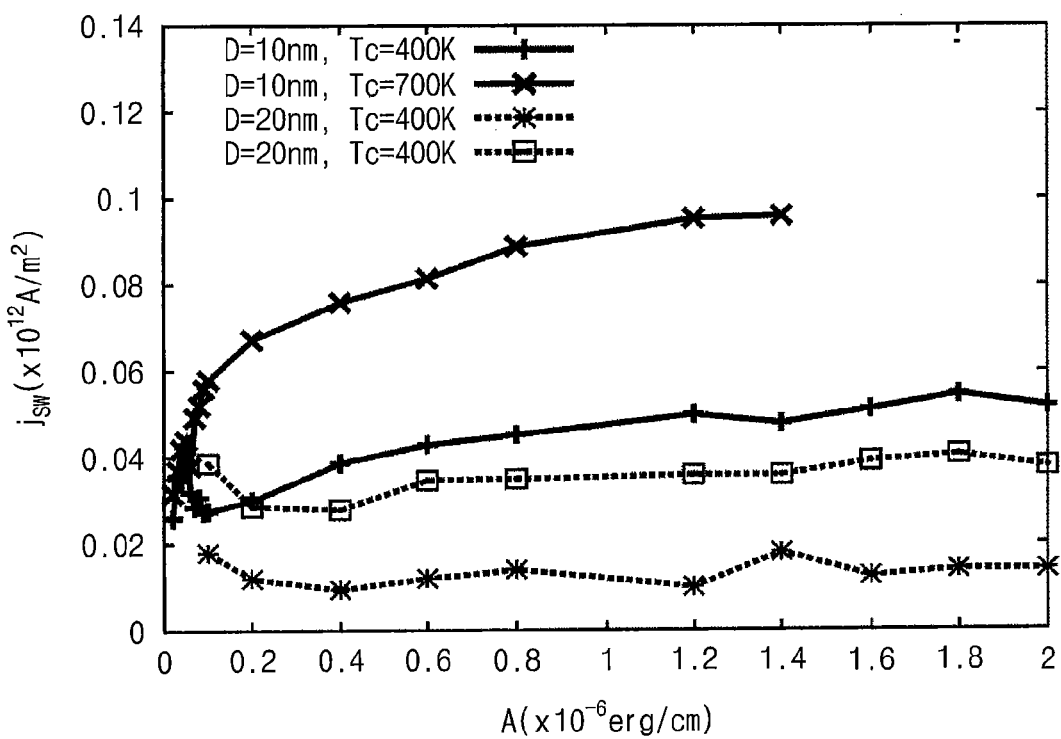
FIG. 16 is a graph showing a relationship between an exchange stiffness constant and a current density.
Figure 17:
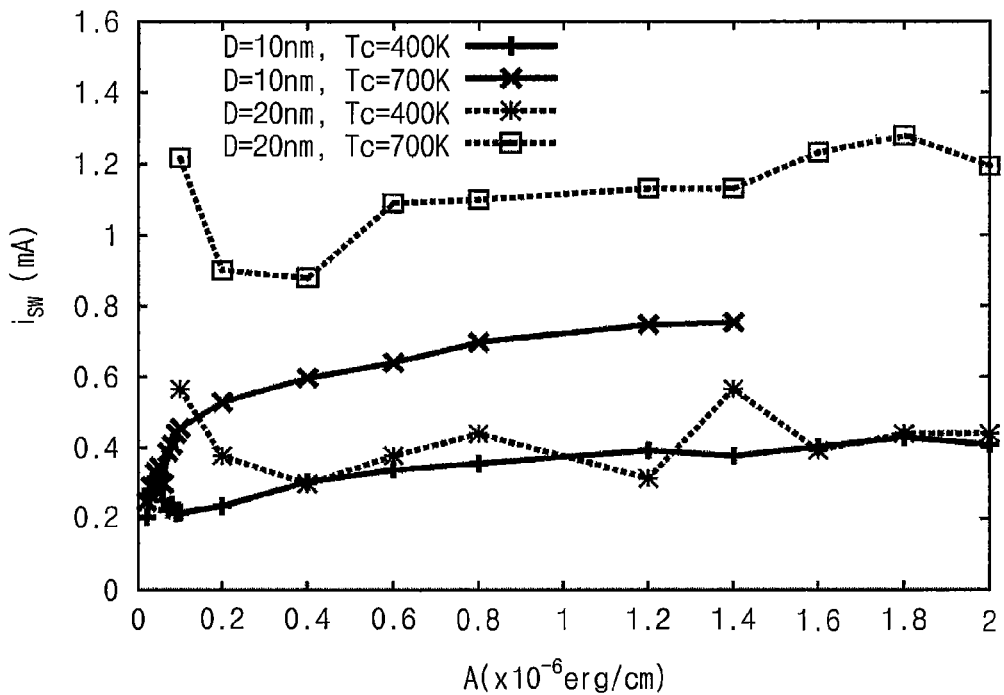
FIG. 17 is a graph showing a relationship between an exchange stiffness constant and current amount.

FIGS. 16 and 17 illustrate test results of an exchange stiffness constant. FIG. 16 is a graph showing a relationship between an exchange stiffness constant A (×10$^{-6}$ erg/cm) and a current density j$_{sw}$ (×10$^{12}$ A/m$^2$), and FIG. 17 is a graph showing a relationship between an exchange stiffness constant A (×10$^{-6}$ erg/cm) and a current amount i$_{sw}$ (mA). The exchange stiffness constant A may be controlled by adjusting a thickness of the magnetic-coupling control layer 32C. To reduce the switching current, an optimized value of the exchange stiffness constant A was smaller in the diameter D of 10 nm than in 20 nm. In addition, in the case that the free layer had the same diameter D, the switching current was smaller in the case of the free layer according to example embodiments of the inventive concepts than in the case of the conventional free layer. Accordingly, in the magneto-resistive device according to example embodiments of the inventive concepts, it may be possible to reduce the magnetization switching current, without deterioration in thermal stability. This means that it may possible to improve thermal stability of the magneto-resistive device.

Figure 18:
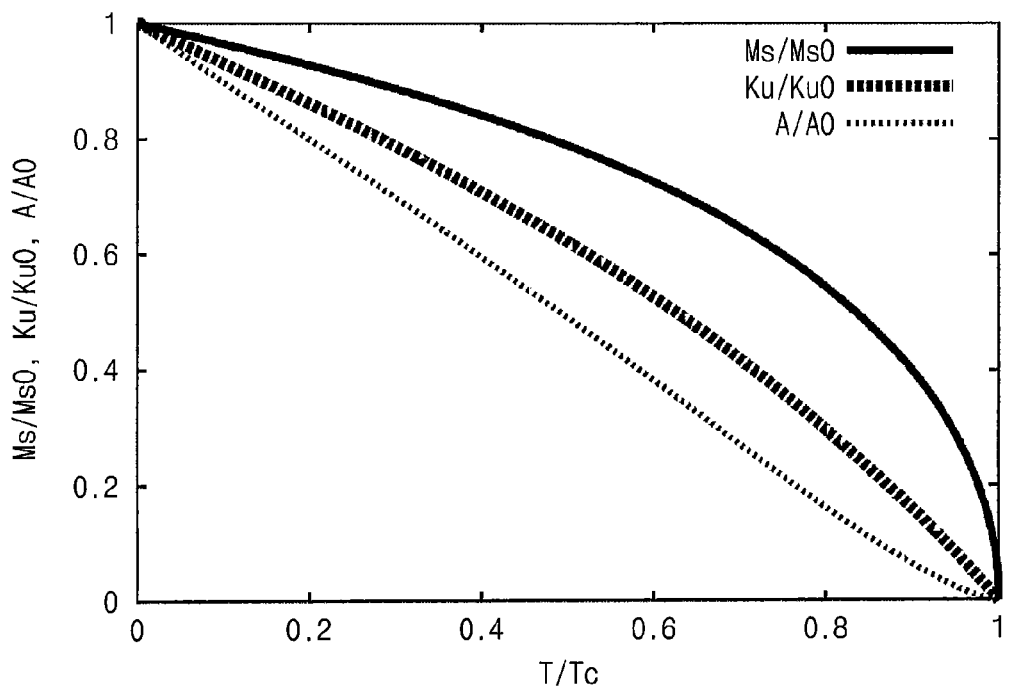
FIG. 18 is a graph illustrating a model of the LLG simulation, in which a parameter is changed depending on a temperature.

FIG. 18 is a graph illustrating a model of the LLG simulation, in which a parameter is changed depending on a temperature.

In the graph of FIG. 18, the horizontal axis represents a parameter associated with a Curie temperature Tc, and the vertical axis represents three parameters associated with magnetic moment Ms, perpendicular magnetic anisotropy constant Ku, or exchange stiffness constant A. In other words, parameters (MS/MS0, Ku/Ku0, and A/A0) are plotted over a range of T/Tc. T/Tc is a ratio of a material temperature T to a Curie temperature Tc of the material, and T is the material temperature under the presence of a current flow (i.e., the material temperature when a current flows through the material). Ms0, Ku0, and A0 are values of magnetic moment Ms, perpendicular magnetic anisotropy constant Ku, or exchange stiffness constant A at the material temperature T of 0K.

Other example embodiments of the inventive concepts will be described.

Figure 19A:
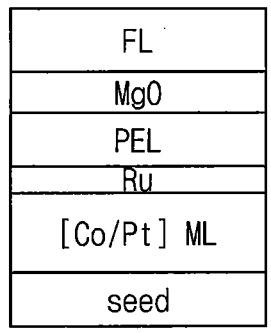
FIGS. 19A through 19E are diagrams illustrating examples of material combinations for a free layer.

FIG. 19A illustrates an example of a structure of an STT-MRAM. In FIG. 19A, FL, MgO, PEL, and Ru denote a free layer, an insulating layer, a reference layer, and a layer for a lattice orientation of the reference layer.

[Co/Pt] ML denotes a perpendicular magnetic preserving layer, and seed denotes a layer for controlling a lattice orientation.

FIGS. 19B through 19E illustrates some examples of a structure of the free layer FL shown in FIG. 19A.

Figure 19B:
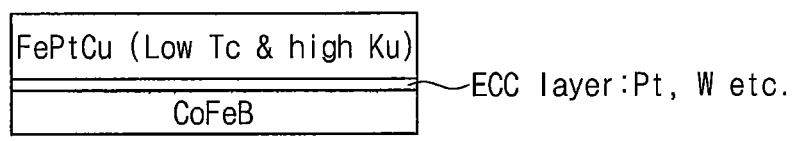
Figure 19C:
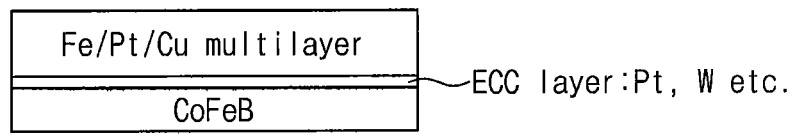
Figure 19D:
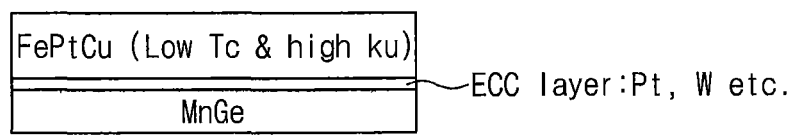
Figure 19E:
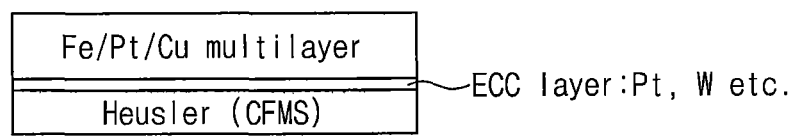

Referring to FIGS. 19B and 19C, a CoFeB layer may be used for a first magnetic layer of the free layer, and a FePtCu layer or a multiple layer of Fe/Pt/Cu may be used for a second magnetic layer. Referring to FIG. 19D, the first magnetic layer may be formed of a MnGe layer, and the second magnetic layer may be formed of a FePtCu layer. Referring to FIG. 19E, the first magnetic layer may be formed of a Heusler layer (e.g., CFMS layer), and the second magnetic layer may be formed of a multiple layer of Fe/Pt/Cu.

For example, FePtCu is a material having a high perpendicular magnetic anisotropy constant Ku and a low Curie temperature Tc, and thus, it may be suitable for the second magnetic layer. A material having a controllable Curie temperature Tc and a high perpendicular magnetic anisotropy may be suitable for the second magnetic layer. For example, magnetic materials (e.g., FePtCu [Co/Pt]n, TbFeCo, Mn$_2$RuGa, or Mn$_2$RuGe) may be used as the second magnetic layer.

As an example, when a CoFeB layer was used for the first magnetic layer, and a FePtCu layer or a multiple layer of Fe/Pt/Cu was used for the second magnetic layer, a LLG simulation provide the results as follows:

FePtCu layer
  Magnetic moment (Ms): 600×10E3 A/m (600 emu/cc)
  Perpendicular magnetic anisotropy constant (Ku2): 10×10E5 J/m$^3$ (10×10E6 erg/cc), at room temperature
  Curie temperature (Tc): 250° C. (523.15K)
  Damping constant α=0.01
CoFeB layer
  Magnetic moment (Ms): 1×10E6 A/m (1000 emu/cc)
  Perpendicular magnetic anisotropy constant (Ku1): 2×10E5 J/m$^3$ (2×10E6 erg/cc), at room temperature
  Curie temperature (Tc): 250° C. (523.15K) or higher
  Damping constant α=0.01

In the afore-described four examples of the structure of the free layer, the magnetic-coupling control (ECC) layer may include at least one of, for example, Pd, Pt, Ru, MgO, Ta, and/or W.

The second magnetic layer of the free layer may include, for example, MnGeX, [Co/Pt]n, TbFeCo, FePtCu, and/or Mn2RuGa.

As described above, the magneto-resistive device, which is configured to have a perpendicular magnetization property and perform a reading operation using a magneto-resistance effect, is well resistant to thermal disturbance caused by a reduction in pattern size and thus, it is being expected as a next-generation memory device. However, it suffers from various technical difficulties. For example, there is a difficulty in forming a ferromagnetic layer with a high perpendicular magnetic anisotropy. By adding a perpendicular magnetization preserving layer in the magnetic tunnel junction, it is possible to relieve such a difficulty, but since this method leads to an increase in magnetization switching current, it is hard to realize a low power device. To overcome these technical issues, according to example embodiments of the inventive concepts, the magneto-resistive device may include a magnetic tunnel junction, in which an insulating thin-film is interposed between two ferromagnetic layers, and a perpendicular magnetization layer with a low Curie temperature Tc is used in the magneto-resistive device to serve as a perpendicular magnetization preserving layer. Accordingly, it may be possible to preserve magnetization thermal stability of a free layer (or a data-storage layer) and to reduce a magnetization switching current, thereby allowing for commercialization of STT-MRAM devices.

In more detail, the magneto-resistive device according to example embodiments of the inventive concepts may include a free layer, in which at least a first magnetic layer and a second magnetic layer are provided. The second magnetic layer may have a Curie temperature lower than that of the first magnetic layer, and this may make it possible to reduce a write current using a device temperature increase during a writing operation. For example, compared with the conventional technology, it may be possible to reduce electric power required for the writing operation by 50% or more.

The inventive concepts can be applied to realize a MTJ device for magnetic memory devices (for example, a high-density spin transfer torque magnetic random access memory (STT-MRAM) device or a racetrack-memory device (e.g., a nonvolatile memory device based on magnetic domains)) using a spin transfer magnetization inversion technique (e.g., a STT technique).

According to example embodiments of the inventive concepts, it is possible to provide a magneto-resistive device with reduced power consumption and improved stability.

While example embodiments of the inventive concepts have been particularly shown and described, it will be understood by one of ordinary skill in the art that variations in form and detail may be made therein without departing from the spirit and scope of the attached claims.

What is claimed is:

1. A magneto-resistive device comprising:
a magnetic tunnel junction comprising:
a pinned layer;
a free layer having a first magnetic anisotropy and comprising a first magnetic layer and a second magnetic layer, the second magnetic layer having a Curie temperature that is lower than a Curie temperature of the first magnetic layer and having a second perpendicular magnetic anisotropy; and
an insulating layer between the pinned layer and the free layer,
wherein the second magnetic layer has a perpendicular magnetic anisotropy constant that is higher than $5 \times 10E5$ J/m$^3$.

2. The magneto-resistive device of claim 1, wherein the Curie temperature of the second magnetic layer ranges from about 350K to about 500K.

3. The magneto-resistive device of claim 1, wherein the first magnetic anisotropy is in-plane.

4. The magneto-resistive device of claim 1, wherein the first magnetic anisotropy has a direction perpendicular to a surface of the free layer and a magnetic anisotropy constant that is in a range of about $2 \times 10E5$ J/m$^3$ to about $10E6$ J/m$^3$.

5. The magneto-resistive device of claim 1, wherein the free layer further comprises a magnetic-coupling control layer that is between the first magnetic layer and the second magnetic layer and is configured to control a magnetic coupling between the first and second magnetic layers.

6. The magneto-resistive device of claim 1, wherein the second magnetic layer comprises FePtCu, [Co/Pt]n, TbFeCo, Mn2RuGa, Mn2RuGe, or other ferromagnetic material.

7. The magneto-resistive device of claim 1, wherein the magneto-resistive device has resistance of about 30 $\Omega\mu m^2$ or less.

8. The magneto-resistive device of claim 1, wherein the Curie temperature of the second magnetic layer is lower than a temperature of the second magnetic layer during a writing operation and is higher than a temperature of the second magnetic layer during a reading operation.

9. A magneto-resistive device comprising:
a magnetic tunnel junction comprising:
a pinned layer;
a free layer comprising a first magnetic layer that is configured to be paramagnetic during a writing operation and is configured to be ferromagnetic during a reading operation, wherein a writing current flows through the free layer during the writing operation; and
an insulating layer between the pinned layer and the free layer.

10. The device of claim 9, wherein the free layer further comprises a second magnetic layer,
wherein the second magnetic layer is disposed between the insulating layer and the first magnetic layer, and the second magnetic layer is configured to be ferromagnetic during the writing operation.

11. The device of claim 10, wherein the free layer further comprises a magnetic-coupling control layer disposed between the first magnetic layer and the second magnetic layer.

12. The device of claim 11, wherein the magnetic-coupling control layer comprises Pd, Pt, Ru, MgO, Ta and/or W.

13. The device of claim 10, wherein the first magnetic layer has a Curie temperature that is lower than a Curie temperature of the second magnetic layer.

14. The device of claim 9, wherein the first magnetic layer has a magnetic anisotropy that is perpendicular to a surface of the first magnetic layer, and
wherein the surface of the first magnetic layer faces the pinned layer.

15. A magneto-resistive device comprising:
a magnetic tunnel junction comprising:
a pinned layer;
a free layer comprising a first magnetic layer having a first Curie temperature that is lower than a temperature of the first magnetic layer during a writing operation and is higher than a temperature of the first magnetic layer during a reading operation, wherein a writing current flows through the free layer during the writing operation; and an insulating layer between the pinned layer and the free layer.

16. The device of claim 15, wherein the free layer further comprises a second magnetic layer, wherein the second magnetic layer is disposed between the insulating layer and the first magnetic layer, and the second magnetic layer has a second Curie temperature that is higher than the first Curie temperature.

17. The device of claim 16, wherein the free layer further comprises a magnetic-coupling control layer disposed between the first magnetic layer and the second magnetic layer.

18. The device of claim 17, wherein the magnetic-coupling control layer comprises Pd, Pt, Ru, MgO, Ta and/or W.

19. The device of claim 15, wherein the first Curie temperature ranges from about 350K to about 500K.

\* \* \* \* \*